(12) United States Patent
Kang et al.

(10) Patent No.: US 10,095,810 B2
(45) Date of Patent: Oct. 9, 2018

(54) SEAM MODIFICATION FOR 3D CAD MODELS

(71) Applicant: Siemens Product Lifecycle Management Software Inc., Plano, TX (US)

(72) Inventors: Aarcus Kang, Concord, MA (US); Johan Arendt Grape, Boxborough, MA (US); Marc Attar, Somerville, MA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 775 days.

(21) Appl. No.: 14/321,140

(22) Filed: Jul. 1, 2014

(65) Prior Publication Data

US 2016/0004790 A1    Jan. 7, 2016

(51) Int. Cl.
   *G06F 17/50*    (2006.01)

(52) U.S. Cl.
   CPC .......... *G06F 17/50* (2013.01); *G06F 17/5086* (2013.01)

(58) Field of Classification Search
   CPC ..... G06F 17/50; G06F 17/5086; G06T 11/203
   USPC .......................................... 703/1; 700/97–98
   See application file for complete search history.

(56) References Cited

U.S. PATENT DOCUMENTS

| | | | | |
|---|---|---|---|---|
| 9,336,628 | B2 * | 5/2016 | Chuang | .................. G06T 17/30 |
| 2009/0070075 | A1 * | 3/2009 | Funk | ..................... G06T 1/0028 |
| | | | | 703/1 |

OTHER PUBLICATIONS

Hoffmann et al. "Constrained shape modification of cubic B-spline curves by means of knots". Computer-Aided Design 36 (2004) p. 437-445.*
EP Search Report for EP Application No. 15173611.3, dated Nov. 4, 2015, 13 pages.
Piegl, L. "Modifying the Shape of Rational B-splines. Part 1: Curves," Computer-Aided Design; vol. 21, No. 8, Oct. 1, 1989, London, GB; XP 000088133, 10 pages.
Bole, Marcus, "A Hull Surface Generation Technique Based on a Form Topology and Geometric Constraint Approach," PhD Thesis; Submitted to the University of Strathclyde, Jul. 1, 2002, XP055223857, Glasgow, GB, 74 pages.
Botsch, Mario et al., "An Intuitive Framework for Real-Time Freeform Modeling," ACM Transactions on Graphics (TOG); Aug. 1, 2004, New York, XP055223710, 6 pages.

* cited by examiner

*Primary Examiner* — Eunhee Kim

(57) ABSTRACT

Various disclosed embodiments include a method to be performed by a data processing system and including identifying an original curve and an intended location of a new curve in a CAD model. The method also includes generating a transition curve from the original curve. The method further includes determining a displacement function of the new curve and applying the displacement function to the transition curve. The displacement function includes two or more control points. The method includes combining the two or more control points into one transition curve control point. The method also includes adjusting the transition curve control point based on a fullness value so that transition curve overlays the location of the new curve.

20 Claims, 19 Drawing Sheets

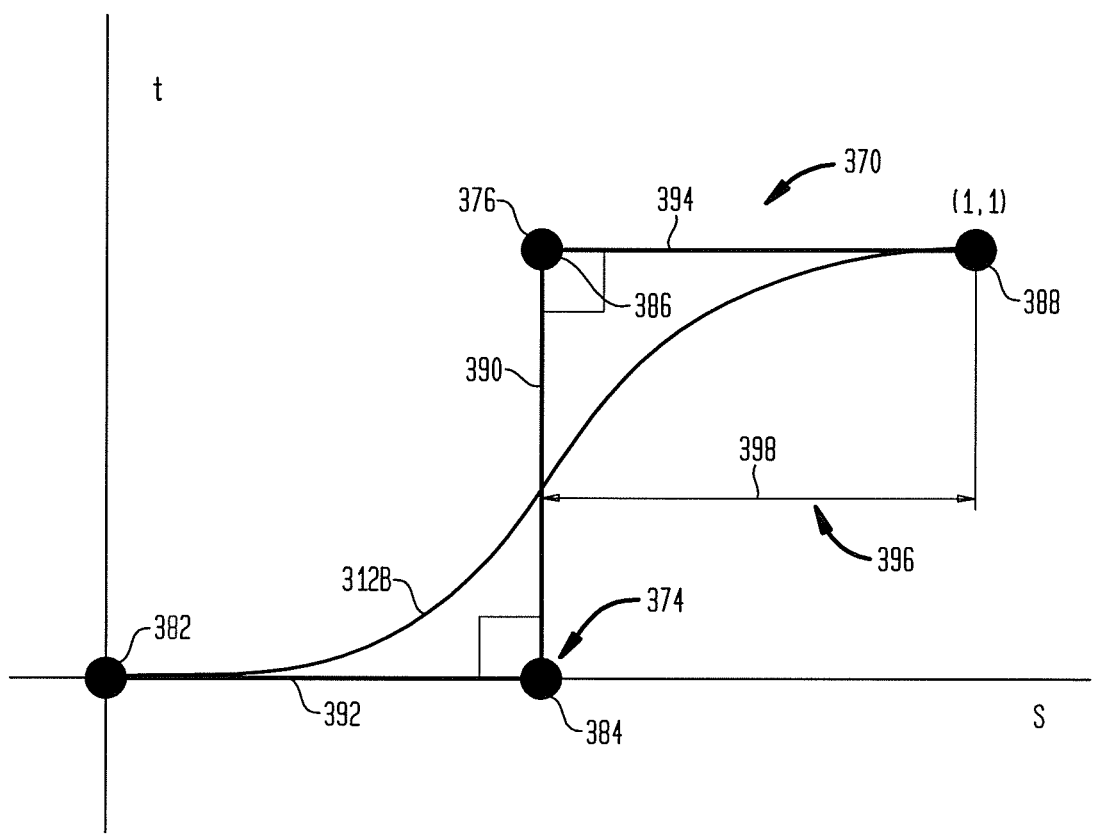

FIG. 12A   FIG. 12B   FIG. 12C   FIG. 12D
 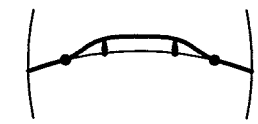  
FIG. 12E   FIG. 12F   FIG. 12G   FIG. 12H
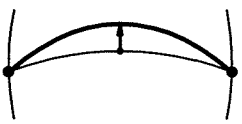   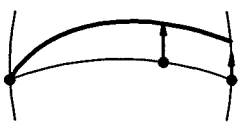
FIG. 12I   FIG. 12J   FIG. 12K   FIG. 12L
   
FIG. 12M   FIG. 12N   FIG. 12O   FIG. 12P
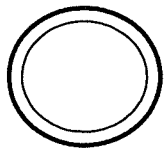 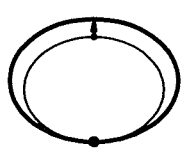 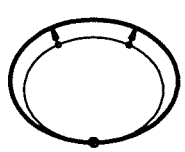 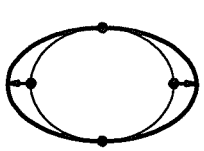
FIG. 13
| SEAM MODIFICATION | | |
|---|---|---|
| SEAM | S1 | 1320 |
| OFFSET POINT(S) | P1,P2 | 1322 |
| LIMIT POINT(S) | P3,P4 | 1324 |
| MAX OFFSET | 20mm | 1326 |
| FULLNESS | 50% | 1328 |
| 1332 ☐ | REVERSE DIRECTION | |
| | MODIFY | 1330 |
1318

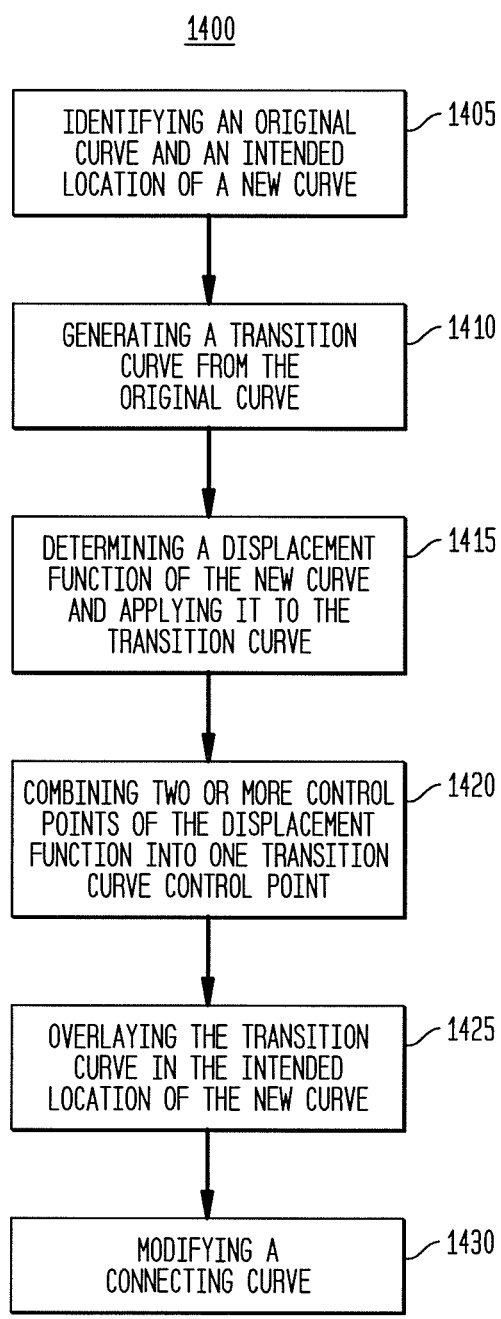

SEAM MODIFICATION FOR 3D CAD MODELS

TECHNICAL FIELD

The present disclosure is directed, in general, to computer-aided design, visualization, and manufacturing systems ("CAD systems"), and systems, that manage data for products and other items (collectively, "Product Data Management" systems or PDM systems).

BACKGROUND OF THE DISCLOSURE

CAD systems are useful for designing and visualizing three-dimensional (3D) models and models. Improved systems are desirable.

SUMMARY OF THE DISCLOSURE

Various disclosed embodiments include a method to be performed by a data processing system and including identifying an original curve and an intended location of a new curve in a computer-aided design (CAD) model. The method also includes generating a transition curve from the original curve. The method further includes determining a displacement function of the new curve and applying the displacement function to the transition curve. The displacement function includes two or more control points. The method includes combining the two or more control points into one transition curve control point. The method also includes adjusting the transition curve control point based on a fullness value so that transition curve overlays the location of the new curve.

Various disclosed embodiments also include a data processing system including a processor. The data processing system also includes an accessible memory. The data processing system is particularly configured to identify an original curve and an intended location of a new curve in a computer-aided design (CAD) model. The data processing system is also configured to generate a transition curve from the original curve. The data processing system is further configured to determine a displacement function of the new curve and apply the displacement function to the transition curve. The displacement function includes two or more control points. The data processing system is configured to combine the two or more control points into one transition curve control point. The data processing system is also configured to adjust the transition curve control point based on a fullness value so that transition curve overlays the location of the new curve.

Various disclosed embodiments further include a non-transitory computer-readable medium encoded with executable instructions that, when executed, cause one or more data processing systems to identify an original curve and an intended location of a new curve in a computer-aided design (CAD) model. The non-transitory computer-readable medium also causes one or more data processing systems to generate a transition curve from the original curve. The non-transitory computer-readable medium further causes one or more data processing systems to determine a displacement function of the new curve and apply the displacement function to the transition curve. The displacement function includes two or more control points. The non-transitory computer-readable medium further causes one or more data processing systems to combine the two or more control points into one transition curve control point. The non-transitory computer-readable medium further causes one or more data processing systems to adjust the transition curve control point based on a fullness value so that transition curve overlays the location of the new curve.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 3B and 3C illustrate example Cartesian coordinate graphs of displacement functions according to this disclosure;

FIGS. 12A, 12B, 12C, 12D, 12E, 12F, 12G, 12H, 12I, 12J, 12K, 12L, 12M, 12N, 12O, and 12P illustrate example diagrams of curve or seam modification use cases according to this disclosure;

FIG. 13 illustrates an example diagram of a user interface associated with the according to this disclosure; and FIG. 14 illustrates an example method to be performed by a data processing system in a CAD system on a CAD model with one or more curves according to this disclosure.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Figure 1:
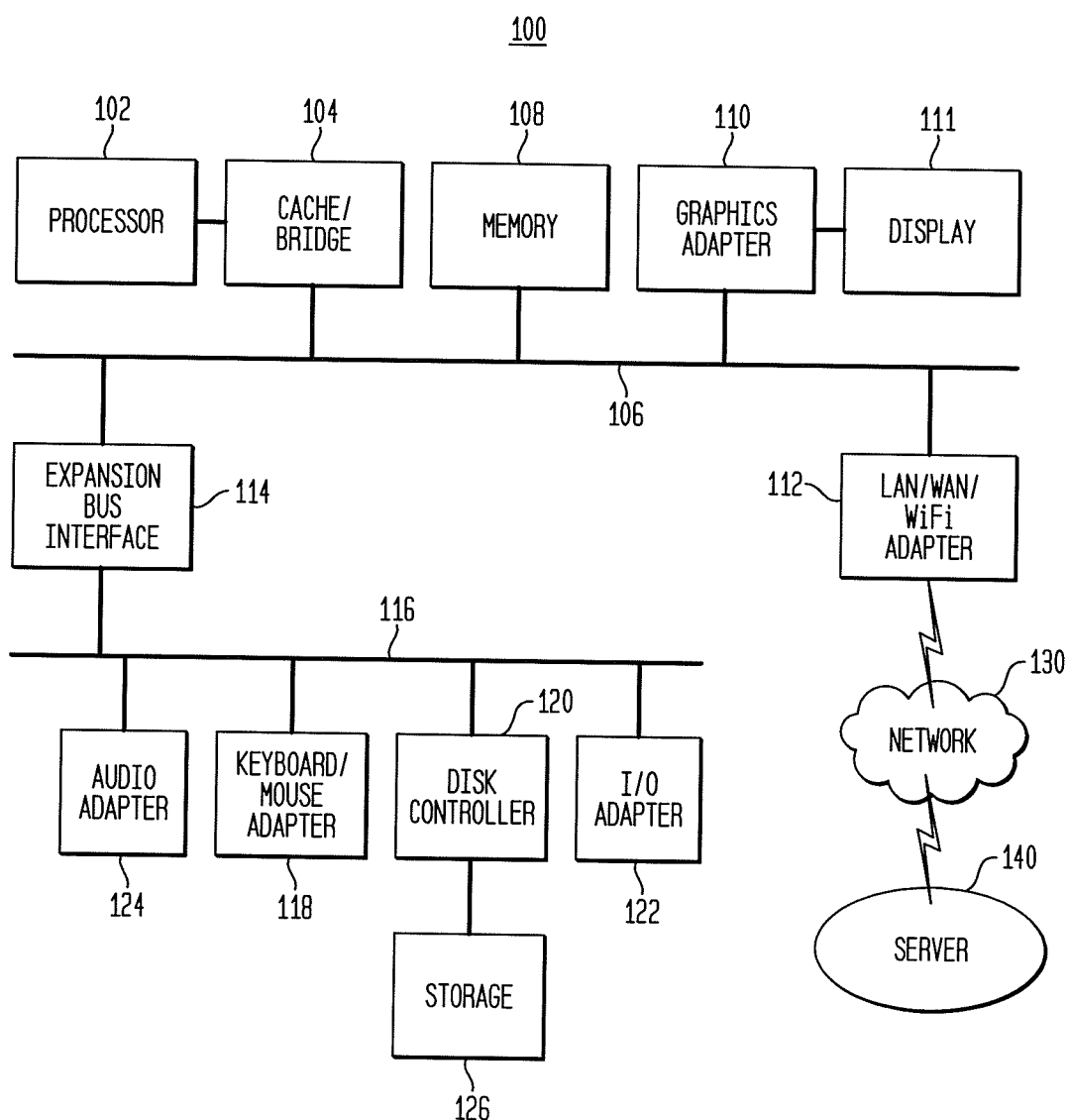
FIG. 1 illustrates a block diagram of a data processing system in which an embodiment can be implemented.

FIG. 1 illustrates a block diagram of a data processing system 100 in which an embodiment can be implemented, for example in a CAD or PDM system particularly configured by software or otherwise to perform the processes as described herein, and in particular as each one of a plurality of interconnected and communicating systems as described herein. The data processing system 100 depicted can include a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111. In an embodiment, the main memory 108 and the storage 126 can be configured to store one or more displacement functions which can be used to maintain or change the shape of a transition curve as will be discussed further herein.

Other peripherals, such as local area network (LAN)/Wide Area Network/Wireless (e.g. Wi-Fi) adapter 112, can also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) can be connected for playing sounds. Keyboard/mouse adapter 118 can provide a connection for a pointing device (not shown), such as a mouse, trackball, track pointer, touchscreen, etc.

Those of ordinary skill in the art will appreciate that the hardware depicted in FIG. 1 may vary for particular implementations. For example, other peripheral devices, such as an optical disk drive and the like, also can be used in addition or in place of the hardware depicted. The depicted example is provided for the purpose of explanation only and is not meant to imply architectural limitations with respect to the present disclosure.

A data processing system 100 in accordance with an embodiment of the present disclosure can include an operating system employing a graphical user interface. The operating system permits multiple display windows to be presented in the graphical user interface simultaneously, with each display window providing an interface to a different application or to a different instance of the same application. A cursor in the graphical user interface can be manipulated by a user through the pointing device. The position of the cursor can be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system.

Computer-Aided Design (CAD) systems can be used to model a plurality of objects in a virtual 3D environment. Many of these objects can have seams, edges, or the like (such as curved seams) (collective hereinafter "seams" or "curves") to provide shape and contour to the object. Seams of a 3D CAD model modelling an object can be modified geometrically in a 3D CAD system for aesthetic purposes, comfort purposes (such as in the case of seat covers), manufacturing purposes, and the like. For example, a seam can be modified by bending or offsetting, either the entire seam or only a portion of the seam. Seams can also be interconnected with other seams on the same object such that after a seam has been modified one or more other seams may require modification in order to maintain the interconnection between seams.

Figure 2:
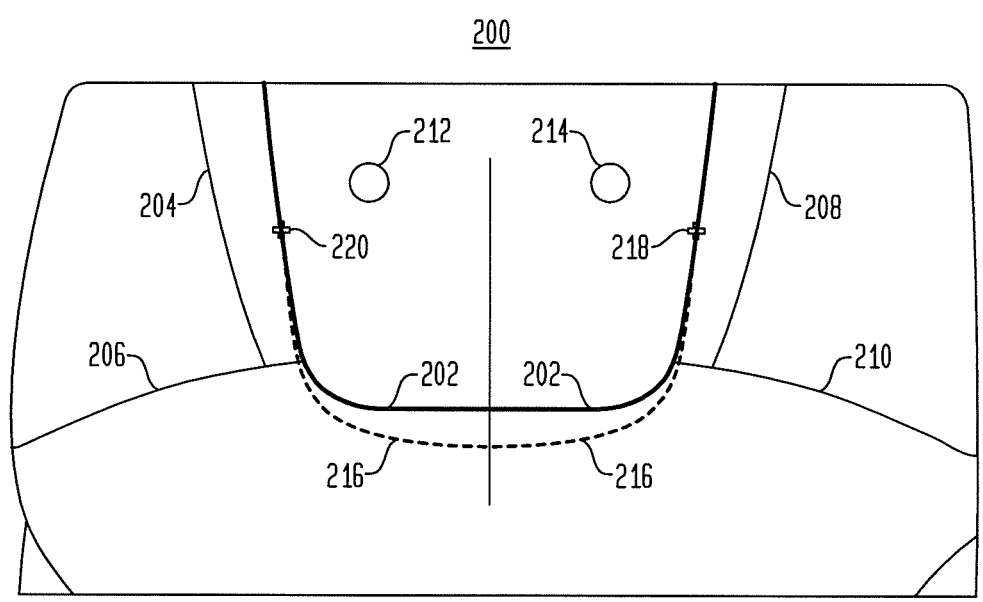
FIG. 2 illustrates an example of a seam modification according to this disclosure.

FIG. 2 illustrates an example of a seam modification according to this disclosure. As illustrated in FIG. 2, a seat back trim cover 200 can include a plurality of seams 202, 204, 206, 208, 210, 212, and 214. In an embodiment, seam 202 can be an original seam. In order to reduce wrinkle during sewing of the seat back trim cover 200, for example, the seam 202 can be modified to produce new seam 216. For example, seam 202 can be bent or extended at or between fixed points 218 and 220 to produce new seam 216 at the new seam location. In an embodiment, because seams 206 and 210 are connected to seam 202, after seam 202 is converted to new seam 216, seams 206 and 210 can be modified (such as trimmed) so that seams 206 and 210 connect with new seam 216 without extending through new seem 216.

As illustrated in FIG. 2, modifying seams and subsequently modifying additional seams to maintain an interconnection between seams can be tedious and time consuming tasks. These tasks can also require the skill of a CAD operator with the experience to achieve the desired shape and quality of the final curve and to choose the right combination of CAD tools in order to do so. For example, due to the constraints from control point locations and spacing, it can be difficult to bend or extend seam 202 the distance required to convert seam 202 into new seam 216 while attaining the desired shape and location of new seam 216. Additional time and effort may also be necessary to modify the affected seams (such as seams 206 and 210) to maintain seam network connectivity. Furthermore, an assortment of CAD tools (such as join, split, trim, extend, spline, bridge, isoparametric, projection, offset, and the like) may be used to convert an original seam to a new seam. In one or more embodiments disclosed herein, a data processing system 100 or a 3D CAD (hereinafter "system 100") system 100 of a 3D CAD system can be used to (1) control or change a seam curve to attain the location and shape of a new seam curve through a single parameter; (2) automatically maintain seam network connectivity; and (3) consolidate a plurality of CAD tools in order to control or change a seam curve to attain the location and shape of a new seam curve and to maintain seam network connectivity. In an embodiment, other curves functions such as B-spline curves, nurbs curves, and analytical functions can be used. Even though a seam curve can be controlled or changed through a single parameter, curve can also be controlled or change by consolidating parameters into two or more parameters. In an embodiment, different curve shapes and correlating curve functions can be stored for example in a table and referenced to determine which parameters and how those parameters can be consolidated.

Figure 3A:
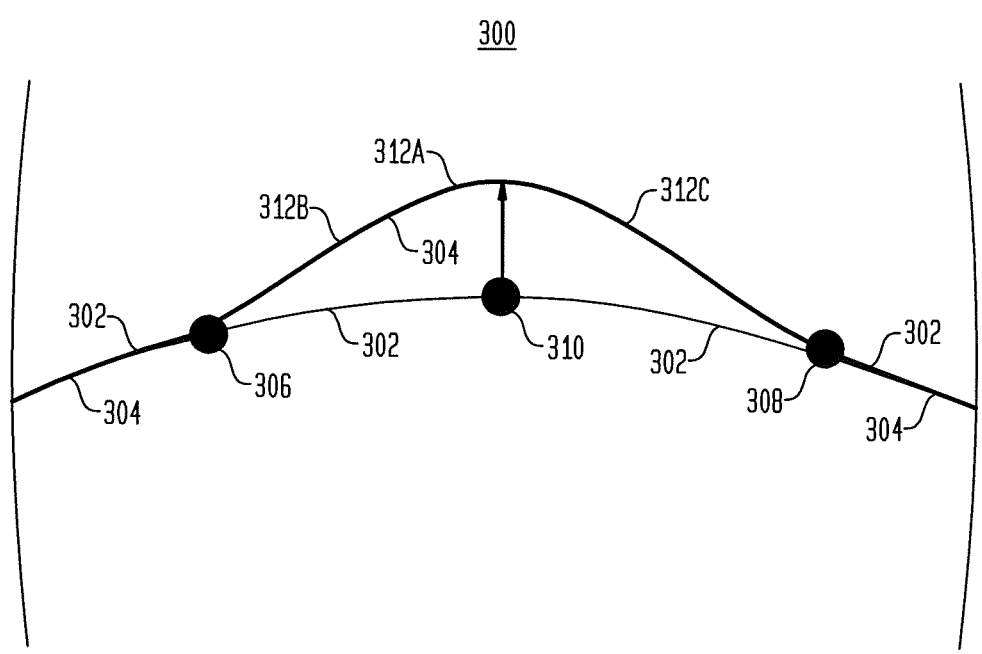
FIG. 3A illustrates an example of a graphical transition between an original curve and a new curve according to this disclosure.

FIG. 3A illustrates an example of a graphical transition 300 between an original curve 302 and a new curve 304 according to this disclosure. As illustrated in FIG. 3A, the system 100 can identify two limit points 306 and 308 and define the limits (such as ends) of original curve 302 where a modification can occur. The system 100 can also identify an offset point 310 along the original curve 302 and can determine the point from which the original curve 302 can be moved in order to transition from the location of the original curve 302 to the location of the new curve 304. In an embodiment, the offset point 310 can be a maximum offset point such that transition curve 312A has the greatest offset from the location of the original curve 302 at the offset point 310. The system 100 can move a transition curve 312A, which can be the portion of the original curve 302 between limit points (such as limit points 306 and 308) as the offset point 310 moves the original curve 302 to the position of the new curve 304 (such as to at least a point intersecting along the location of the new curve 304). In an embodiment, the system 100 can identify two or more offset points. In this case, the system 100 can move at least the portion of the transition curve 312A between the offset points so that two or more points along the transition curve can intersect with two or more points along the new curve.

The system 100 can also divide the transition curve 312A into at least two transition curve sections 312B and 312C. The transition curve sections 312B and 312C can have many different shapes. The system 100 can determine a displacement function (or delta curve) which can be applied to the transition curve section 312B in order to change or maintain the shape of a transition curve section 312B so that transition curve section 312B overlays (such as lays in the same position as and with the same shape of) the new curve 304.

Figure 3B:
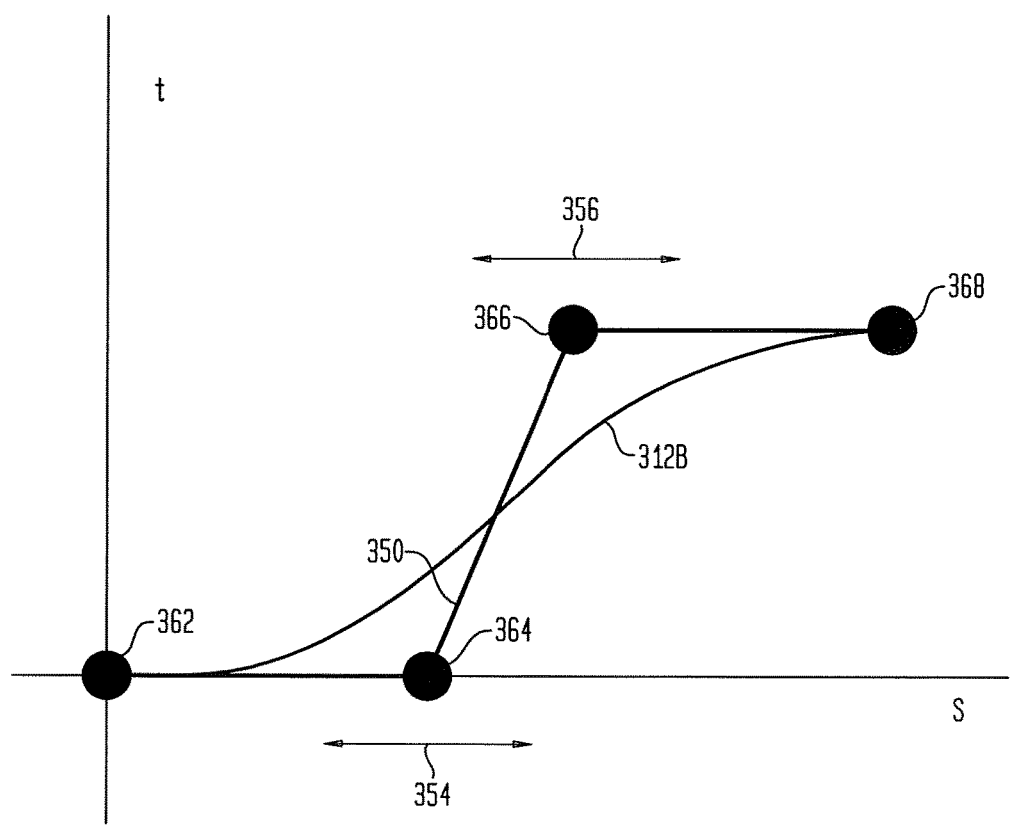

The displacement function of a transition curve section 312B, for example, can be modelled by the system 100 with a plurality of different displacement functions depending on the shape of the new curve 304. FIG. 3B illustrates an example Cartesian coordinate graph of a displacement function 350 according to this disclosure. As illustrated in FIG. 3B, the displacement function 350 of a transition curve section 312B can be a cubic Bezier curve function with two control points: control point 354 controlling the movement of point 364 and control point 356 controlling the movement of point 366. It should be understood that these concepts are the same as if all four points 362, 364, 366, and 368 are considered control points and that points 362 and 368 are fixed so that only points 364 and 366 can move. Points 362 and 368 can represent the limit point 306 and offset point 310, respectively, of transition curve 312A illustrated in FIG. 3A. Accordingly, points 362 and 368 may not have control points associated with them (or points 362 and 368 can be fixed control points) thereby fixing those points in a particular position (such as the relative positions of limit point 306 and offset point 310). In an embodiment, all of the points (such as points 362, 364, 366, and 368) can be manipulated and one or more of those points can be fixed. The displacement function 350 illustrated in FIG. 3B can be used by the system 100 to shape the transition curve section 312B into the shape of the new curve 304 between the limit point 306 and the offset point 310 illustrated in FIG. 3A. In an embodiment, the transition curve 312A can have limit points (such as limit points 306 and 308) and offset points (such as offset point 310) with tangency constraints. Because of these tangency constraints, the system 100 can configure the control points 364 and 366 to limit movement to be horizontal only. The full control of such a displacement function 350 and the overlay of the transition curve section 312B over the new curve 304 can require two separate controls (one for a horizontal displacement of point 364 along with or using control point 354 and the other for a horizontal displacement of point 366 along with or using control point 356).

The system 100 can combine the two separate controls into a single control for example, based on additional assumptions one or more algorithms associated with particular curve shapes or one or more tables associated with particular curve shapes. FIG. 3C illustrates an example Cartesian coordinate graph of a displacement function 370 according to this disclosure. Similar to displacement function 350 of FIG. 3B, displacement function 370 can have two control points: control point 374 controlling the movement of point 384 and control point 376 controlling the movement of point 386. Points 382 and 388 can represent the limit point 306 and offset point 310 of FIG. 3A.

Accordingly, the system 100 may not associate control points with points 382 and 388 thereby fixing those points in a particular position (such as the relative positions of limit point 306 and offset point 310). Also similar to displacement function 350 of FIG. 3B, the system 100 can limit control points 374 and 376 of the displacement function 370 to only horizontal movement due to tangency constraints. However, in order to have a single control, the system 100 can lock control points 374 and 376 in unison by a locking line so that not only do control points 374 and 376 move in a horizontal direction, but control points 374 and 376 also move together in a horizontal direction. FIG. 3C illustrates an example of control points locked in unison such that control point 374 and 376 can be joined and locked in unison by locking line 390 which in this embodiment is perpendicular to horizontal lines 392 and 394. As such, the only remaining control is the horizontal movement of locking line 390. Accordingly, the system 100 can adjust the displacement function based on a relative horizontal position of (or a distance between) a locking line (or a point such as a midpoint along the locking line) and another horizontal position on the Cartesian coordinate graph.

As previously discussed, the system 100 can adjust a displacement function based on changing the relative horizontal position of a locking line (such as locking line 390) with a horizontal position of a point (such as points 382 and 388). For example, the system 100 can assign point 382 with Cartesian coordinate of (0,0) and the point 388 with Cartesian coordinate of (1,1). The horizontal distance of the locking line 390 from the point 382 or the horizontal distance of the locking line 390 from the point 388 (hereinafter "fullness" or "fullness value") can determine the shape of the displacement function. The system 100 can adjust a shape of a displacement function based on the horizontal distance of the locking line 390 from the point 382 or the horizontal distance of the locking line 390 from the point 388. As illustrated in FIG. 3C, a horizontal distance between the locking line 390 and the horizontal coordinate of the point 388 can be indicated by a distance of line 396. The distance of line 396 can indicate a fullness value 398. Accordingly, by providing or determining a fullness value, the system 100 can adjust a shape of a displacement function in order to align the transition curve section 312B with the location of the new curve 304. In an embodiment, the fullness value 398 can be a fraction of a horizontal distance of the transition curve sections 312B.

In an embodiment, once the system 100 models the transition curve section 312B based on the shape of the new curve 304 (such as between the limit point 306 and the offset point 310) and adjusts the displacement function (such as by adjusting the fullness value 398) so that transition curve section 312B overlays the intended position of the new curve 304, the system 100 can apply the same procedure to the transition curve section 312C to overlay the transition curve section 312C over the new curve 304 (such as between the offset point 310 and the limit point 308). In an embodiment, if the new curve 304 from the offset point 310 to the limit point 308 is the mirror image of the new curve 304 from the limit point 306 to the offset point 310, the system 100 can generate the transition curve section 312C based on the mirror image of the transition curve section 312B. The system 100 can then overlay the transition curve section 312C over the intended position of the new curve 304 from the offset point 310 to the limit point 308 without modelling the transition curve section 312C based on the shape of the new curve 304 and without adjusting the displacement function (via adjusting the fullness value) of the transition curve section 312C.

Figure 4A:
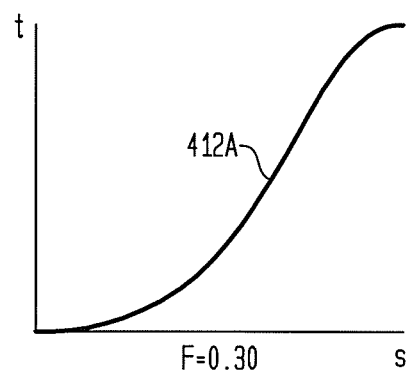
FIGS. 4A, 4B, and 4C illustrate examples of displacement functions with different fullness values according to this disclosure.
Figure 4B:
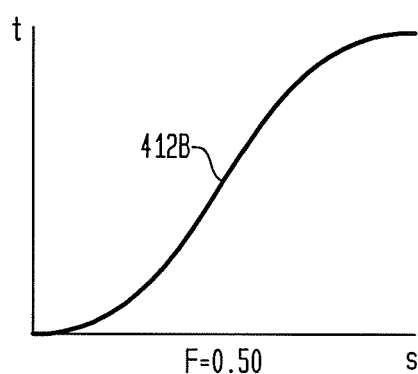
Figure 4C:
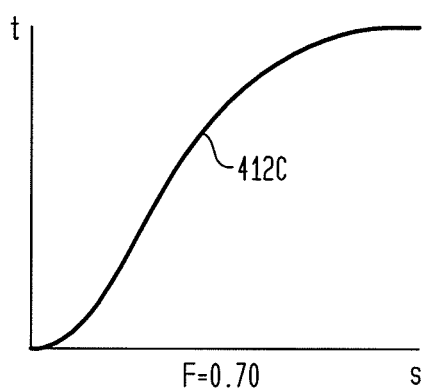

FIGS. 4A, 4B, and 4C illustrate examples of displacement functions with different fullness values according to this disclosure. The transition curves 412A, 412B, and 412C illustrated in FIGS. 4A, 4B, and 4C can be indicative of displacement function 370 illustrated in FIG. 3C with different fullness values 398. For example, FIG. 4A illustrates a transition curve 412A with displacement function 370 having a fullness value 398 of 0.30. FIG. 4B illustrates a transition curve 412B with displacement function 370 having a fullness value 398 of 0.50. FIG. 4C illustrates a transition curve 412C with displacement function 370 having a fullness value 398 of 0.70.

Figure 5A:
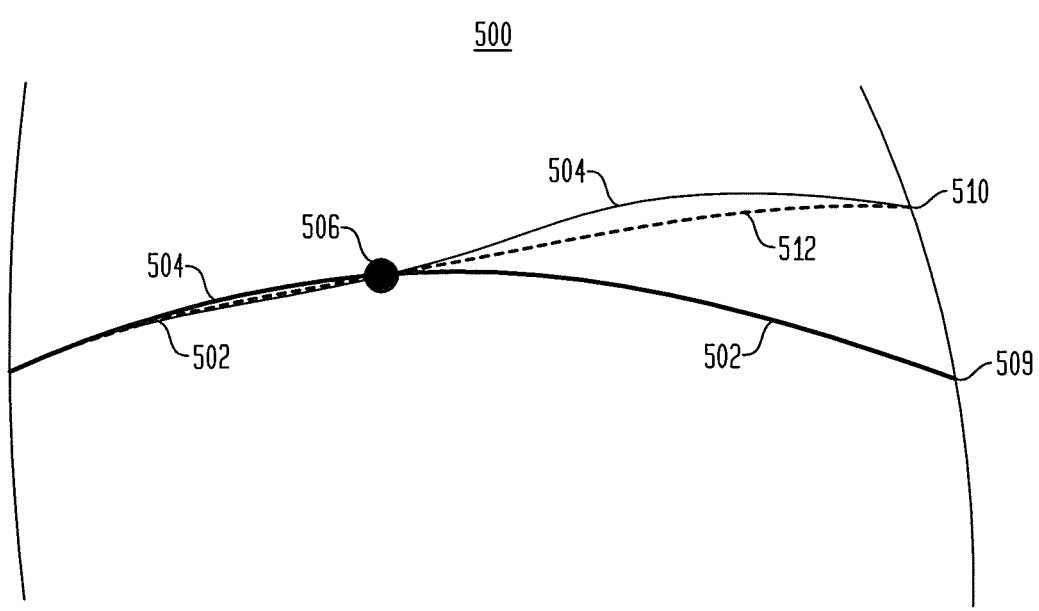
FIGS. 5A, 5B, and 5C illustrate examples Cartesian coordinate graphs of a displacement function according to this disclosure.

In an embodiment, transition curves or transition curve sections with only one tangency constraint can have three controls over the shape of the transition curve. FIG. 5A illustrates an example of a graphical transition 500 between an original curve 502 and a new curve 504 according to this disclosure. As illustrated in FIG. 5A, two limit points 506 and 510, identified by the system 100, can define the limits (such as ends) of original curve 502 where a modification can occur. In an embodiment, a limit point (such as limit point 510) can also be an offset point. As such, the system 100 can identify that the limit point 510 is also the offset point and move the transition curve 512 from the original curve 502 to the location of new curve 504 by dragging the offset point 510 along line 509 until at least the offset point 510 intersects a point along the position of the new curve 504. The transition curve 512 can have many different shapes. The system 100 can determine a displacement function which can be applied to the transition curve 512 in order to change or maintain the shape of a transition curve 512 so that transition curve 512 overlays (such as lays in the same position as and with the same shape of) the new curve 504.

Figure 5B:
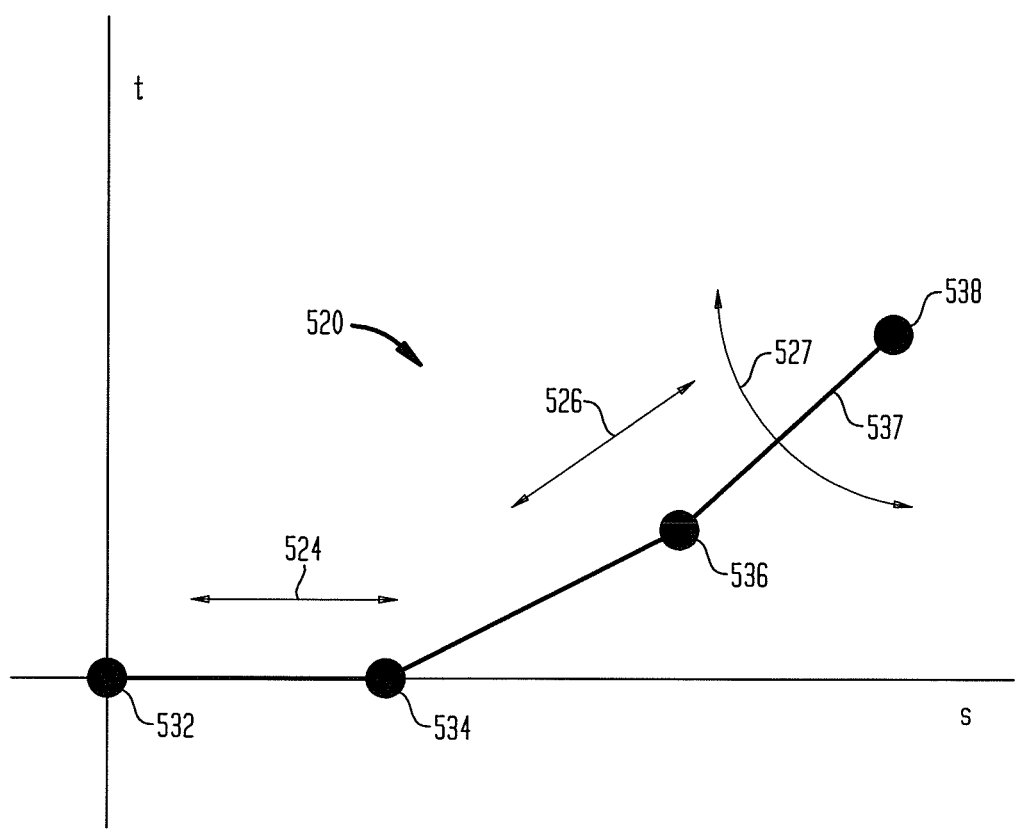

The displacement function of a transition curve 512 can be modelled by the system 100 with a plurality of different curve functions depending on the intended shape of the new curve 504. FIG. 5B illustrates an example Cartesian coordinate graph of a displacement function 520 according to this disclosure. As illustrated in FIG. 5B, the displacement function 520 of a transition curve can be a curve function with three control points: control point 524 controlling the movement of point 534, control point 526 controlling the movement of point 536, and control point 527 controlling the angle of line 537. Points 532 and 538 can represent the limit point 506 and offset point 510 of transition curve 512 illustrated in FIG. 5A. Accordingly, points 532 and 538 may not have control points associated with them thereby fixing those points in a particular position (such as the relative positions of limit point 506 and offset point 510). It should be understood that these concepts can be the same as if points 532, 534, 536, 537, and 538 are all control points and control points 532 and 538 are fixed so that only the remaining control points move. The displacement function 520 illustrated in FIG. 5B can be used by the system 100 to shape the transition curve 512 into the intended shape of the new curve 504 between the limit point 506 and the offset point 510 illustrated in FIG. 5A. In an embodiment, the transition curve 512 can have limit points (such as limit point 506) and offset point (such as offset point 510) with tangency constraints. Because of these tangency constraints, the system 100 can configure the control points 524 to limit point 534 to horizontal movement. The full control of such a displacement function 520 and the overlay of the transition curve 512 over the intended location of the new curve 504 can require three separate controls (one for a horizontal displacement of point 534 using control point 524, one for the displacement of point 536 using control point 526, and one for changing the angle of line 537 using control point 527).

Figure 5C:
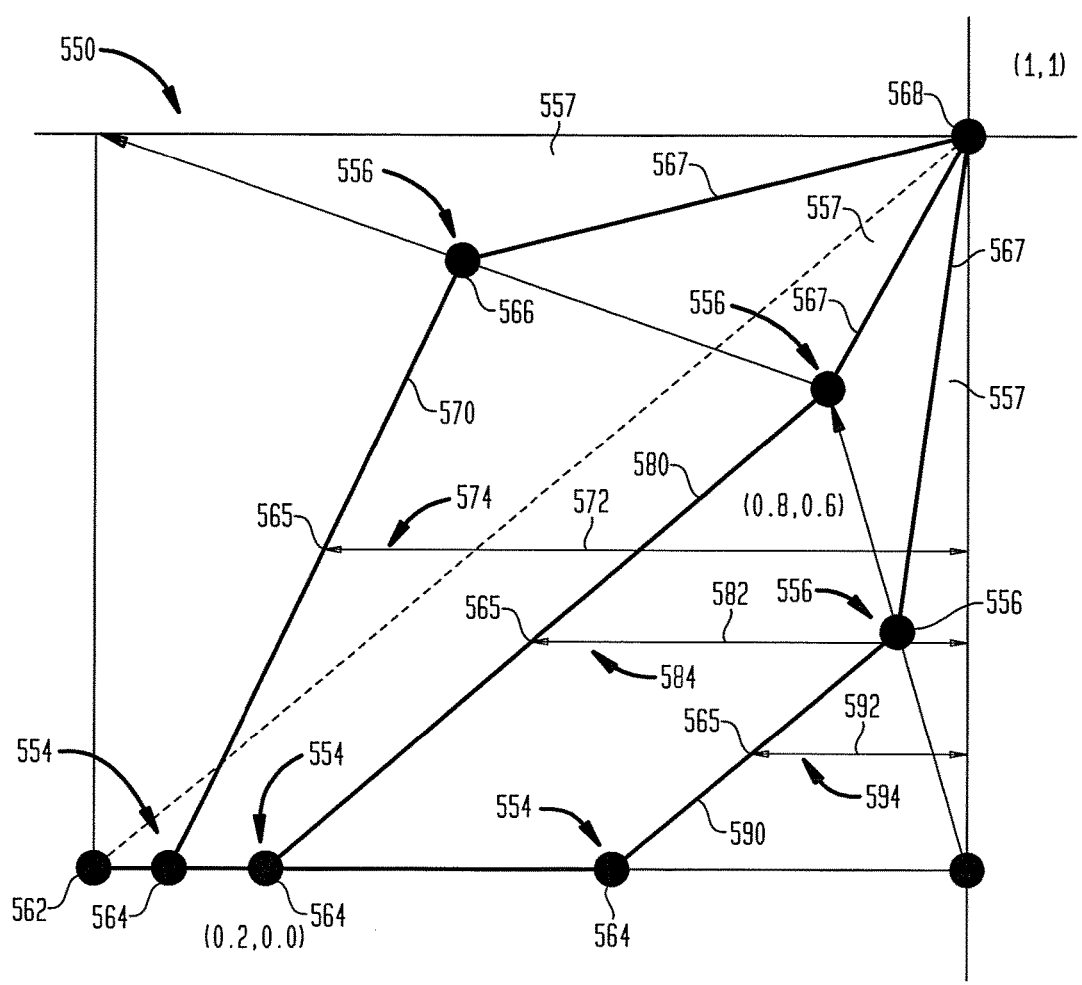

The system 100 can combine the three separate controls (control points 524, 526, and 527) into a single control based on additional assumptions. FIG. 5C illustrates an example Cartesian coordinate graph of a displacement function 550 according to this disclosure. Similar to displacement function 520 of FIG. 5B, displacement function 550 can have three control points: control point 554 controlling the movement of point 564, control point 556 controlling the movement of point 566, and control point 557 controlling the angle of line 567. Points 562 and 568 can represent the limit point 506 and offset point 510 of FIG. 5A. Accordingly, the system 100 may not associate control points with points 562 and 568 thereby fixing those points in a particular position (such as the relative positions of limit point 506 and offset point 510). Also, as illustrated in FIG. 5B, the system 100 can limit control point 564 of the displacement function 550 to only horizontal movement due to tangency constraints. However, in order to have a single control, the system 100 can determine the midpoint (such as midpoints 572, 582, and 592) of line 565 and the measure the horizontal distance between the midpoint of line 565 and a horizontal distance of one of the point 562 (which can represent the limit point 506 of FIG. 5A) or the point 568 (which can represent the offset point 510 of FIG. 5A) in order to determine a fullness value (such as fullness values 574, 584, and 594). As such, the only remaining control is the horizontal movement of the midpoint of the line 565. Accordingly, the system 100 can adjust the fullness value of a displacement function based on a relative horizontal position of (or a distance between) a midpoint of the line 565 and another horizontal position on the Cartesian coordinate graph.

As previously discussed, the system 100 can adjust a fullness value of a displacement function based on changing the relative horizontal position of a midpoint of line 565 with a horizontal position of a point (such as points 562 and 568). For example, the system 100 can assign point 562 with Cartesian coordinate of (0,0) and the point 568 with Cartesian coordinate of (1,1). The horizontal distance of the midpoint (such as midpoints 572, 582, and 592) of line 565 from the point 562 or the horizontal distance of the midpoint of line 565 from the point 568 can determine a fullness value and the shape of the displacement function. For example, when the fullness value is 0.0, points 564 and 566 can be at the starting point (such as position (1,0)). When the fullness value is 0.5, the two control points can move to position (0.2,0.0) and (0.8,0.6), respectively, forming the line 565/580. When the fullness value is 1.0, point 564 can move to position 562 and point 566 can move to position (0.0, 1.0). The other positions can be interpolated from these three positions based on the fullness value. Displacement functions 570, 580 and 590 as illustrated in FIG. 5C can each represent displacement function 550 but with different fullness values. The system 100 can adjust a shape of a displacement function (for example from displacement function 570 to displacement function 580 and to displacement function 590) based on a fullness value (such as fullness values 574, 584, and 594) and in this case the horizontal distance of the midpoint of line 565 from the point 562 or the horizontal distance of the midpoint of line 565 from the point 568. Accordingly, by providing or determining a fullness value, the system 100 can adjust a shape of a displacement function in order to align the transition curve section 512 with the intended location of the new curve 504. In an embodiment, the fullness value (such as fullness values 574, 584, and 594) can be a fraction of a horizontal distance of the transition curve 512.

Figure 6A:
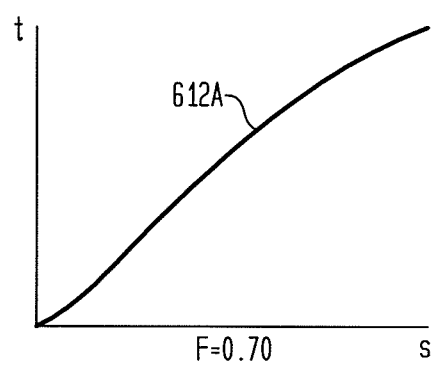
FIGS. 6A, 6B, and 6C illustrate examples of displacement functions with different fullness values according to this disclosure.
Figure 6B:
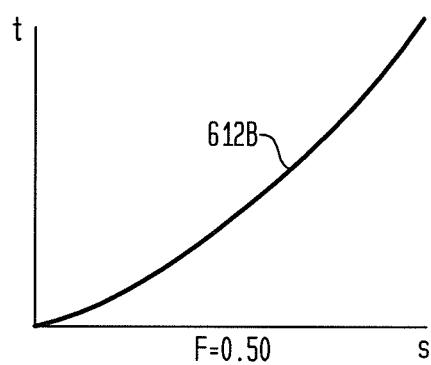
Figure 6C:
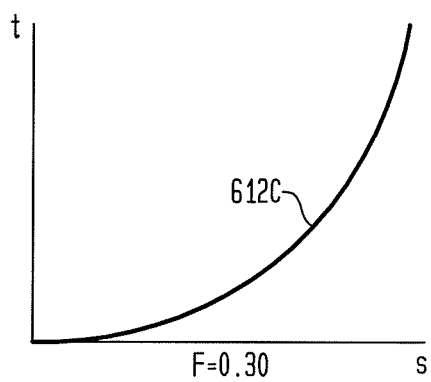

FIGS. 6A, 6B, and 6C illustrate examples of displacement functions with different fullness values according to this disclosure. The transition curves 612A, 612B, and 612C illustrated in FIGS. 6A, 6B, and 6C can be indicative of displacement function 570, 580, and 590 illustrated in FIG. 5C with different fullness values 574, 584, and 594. For example, FIG. 6A illustrates a transition curve 612A with displacement function 570 having a fullness value 574 of 0.70. FIG. 6B illustrates a transition curve 612B with displacement function 580 having a fullness value 584 of 0.50. FIG. 6C illustrates a transition curve 612C with displacement function 590 having a fullness value 594 of 0.30.

Figure 7A:
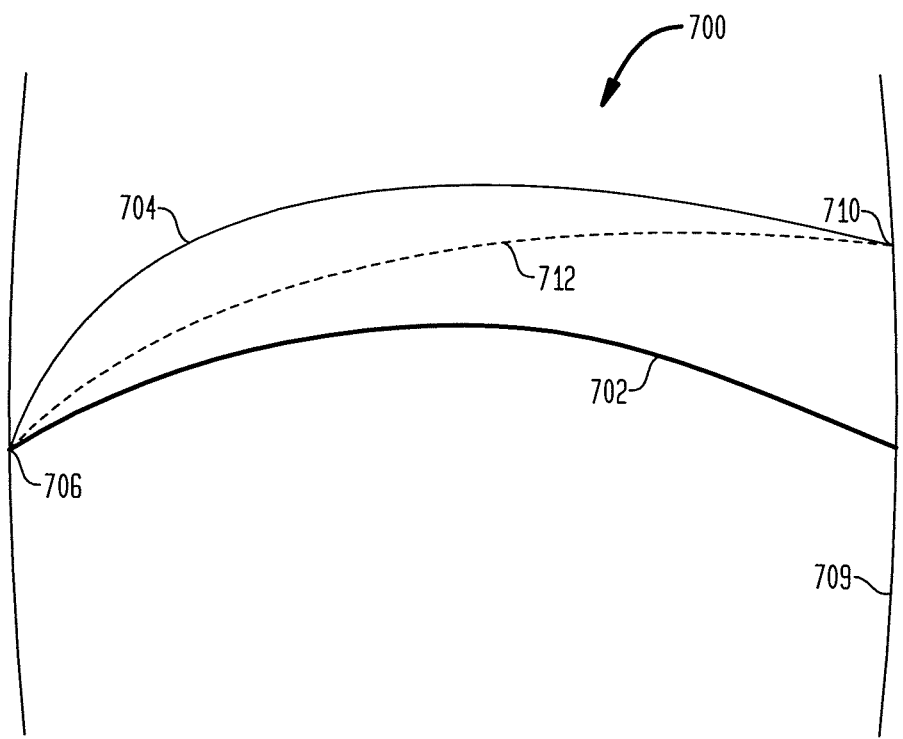
FIG. 7A illustrates an example of a graphical transition between an original curve and an intended location of a new curve according to this disclosure.

In an embodiment, transition curves or transition curve sections with no tangency constraints can have four controls over the shape of the transition curve. FIG. 7A illustrates an example of a graphical transition 700 between an original curve 702 and the intended location of the new curve 704 according to this disclosure. As illustrated in FIG. 7A, two limit points 706 and 710, identified by the system 100, can define the limits (such as ends) of original curve 702 where a modification can occur. In an embodiment, a limit point (such as limit point 710) can also be an offset point. As such, the system 100 can identify that the limit point 710 is also the offset point and move the transition curve 712 from the original curve 702 to the location of the new curve 704 by dragging the offset point 710 along line 709 until at least the offset point 710 intersects a point along the intended location of the new curve 704. The transition curve 712 can have many different shapes. The system 100 can determine a displacement function which can be applied to the transition curve 712 in order to change or maintain the shape of a transition curve 712 so that transition curve 712 overlays the new curve 704.

Figure 7B:
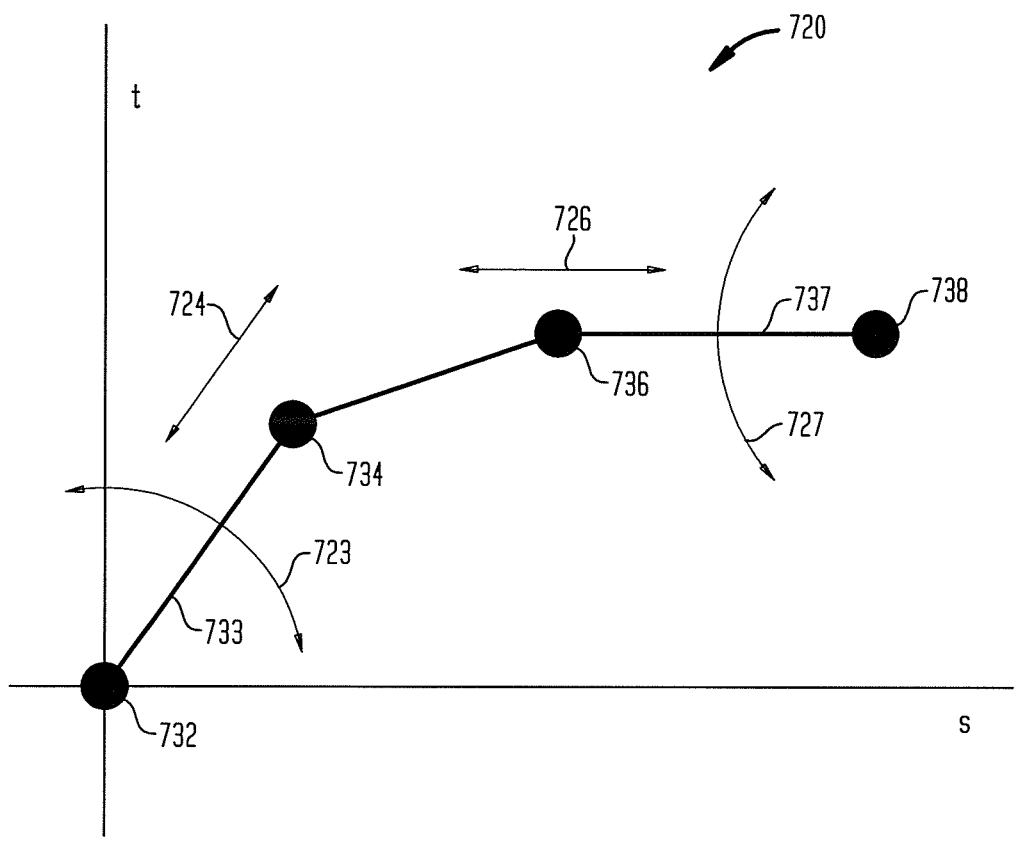
FIGS. 7B and 7C illustrates examples of Cartesian coordinate graphs of a displacement function according to this disclosure.

The displacement function of a transition curve 712 can be modelled by the system 100 with a plurality of different displacement functions depending on the intended shape of the new curve 704. FIG. 7B illustrates an example Cartesian coordinate graph of a displacement function 720 according to this disclosure. As illustrated in FIG. 7B, the displacement function 720 of a transition curve can be a cubic Bezier curve function with four control points: control point 723 controlling the angle of line 733, control point 724 controlling the movement of point 734, control point 726 controlling the movement of point 736, and control point 727 controlling the angle of line 727. Points 732 and 738 can represent the limit point 706 and offset point 710 of transition curve 712 illustrated in FIG. 7A. Accordingly, points 732 and 738 may not have control points associated with them thereby fixing those points in a particular position (such as the relative positions of limit point 706 and offset point 710). It should be understood that these concepts can be the same as if points 732, 733, 734, 736, 737, and 738 are all control points and control points 732 and 738 are fixed so that only the remaining control points move. The displacement function 720 illustrated in FIG. 5B can be used by the system 100 to shape the transition curve 712 into the intended shape of the new curve 704 between the limit point 706 and the offset point 710 illustrated in FIG. 7A. In an embodiment, the transition curve 712 can have points and lines (such as points 734 and 736 and lines 733 and 737) with no tangency constraints. Without tangency constraints, the full control of such a displacement function 720 and the overlay of the transition curve 712 over the location of the new curve 704 can require four separate controls (one for changing the angle of line 733 using control point 723, one for the displacement of point 734 using control point 724, one for the displacement of point 736 using control point 726, and one for changing the angle of line 737 using control point 727).

Figure 7C:
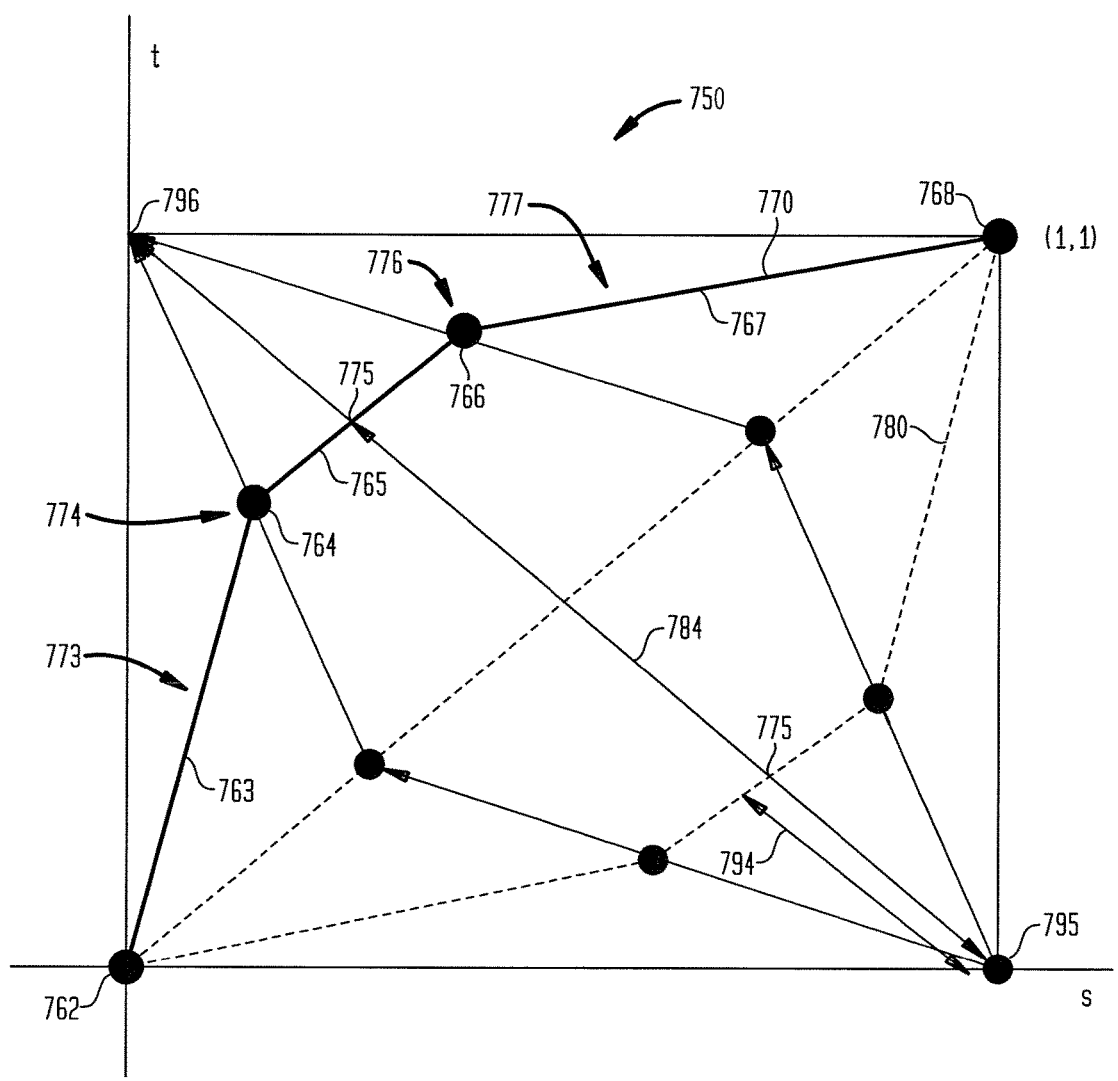

The system 100 can combine the four separate controls (control points 723, 724, 726, and 727) into a single control based on additional assumptions. FIG. 7C illustrates an example Cartesian coordinate graph of a displacement function 750 according to this disclosure. Similar to displacement function 720 of FIG. 7B, displacement function 750 can have four control points: control point 773 controlling the angle of line 763, control point 774 controlling the movement of point 764, control point 776 controlling the movement of point 766, and control point 777 controlling the angle of line 767. Points 762 and 768 can represent the limit point 706 and offset point 710 of FIG. 7A. Accordingly, the system 100 may not associate control points with points 762 and 768 thereby fixing those points in a particular position (such as the relative positions of limit point 706 and offset point 710). In order to have a single control, the system 100 can assign point 762 with Cartesian coordinate of (0,0) and the point 768 with Cartesian coordinate of (1,1). The system 100 can then determine the midpoint 775 of a line 765 based on a line 780 from Cartesian coordinate (0,1) to Cartesian coordinate (1,0) and determine a fullness value 784 based on the distance along the line 780 of the midpoint 775 of line 765 between the Cartesian coordinate (0,1) or the Cartesian coordinate (1,0). As such, the only remaining control is the displacement of the midpoint 775 of the line 765. Accordingly, the system 100 can adjust the fullness value of a displacement function based on a relative position of (or a distance between) a midpoint 775 of the line 765 and another position on the Cartesian coordinate graph.

As previously discussed, the system 100 can adjust a fullness value of a displacement function based on changing the relative position of a midpoint 775 of line 765 with a position of a point. It should be understood, the system 100 can choose line 765 based on the effect that adjusting the position of the midpoint 775 of line 765 has on the control points (such as control points 723, 724, 726, and 727). Displacement functions 770 and 780 as illustrated in FIG. 7C can each represent displacement function 750 but with different fullness values. The system 100 can adjust a shape of a displacement function (for example from displacement function 770 to displacement function 780) based on a fullness value (such as fullness values 784 and 794) and in this case the distance from the midpoint 775 of line 765 to the point 795 ((1,0) on the Cartesian coordinate graph) or the distance from the midpoint 775 of line 765 to the point 796 ((0,1) on the Cartesian coordinate graph). In an embodiment, the fullness value 784 associated with displacement function 770 can be 0.75 and the fullness value 794 associated with displacement function 780 can be 0.25. Accordingly, by providing or determining a fullness value, the system 100 can adjust a shape of a displacement function in order to align the transition curve section 712 with the intended location of the new curve 704.

Figure 8A:
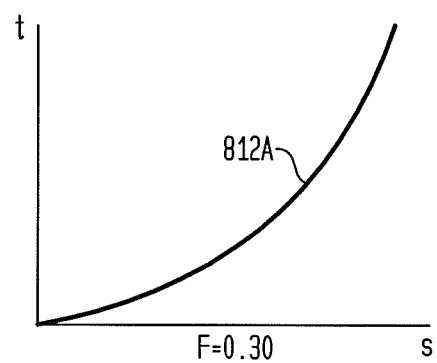
FIGS. 8A, 8B, and 8C illustrate examples of displacement functions with different fullness values according to this disclosure.
Figure 8B:
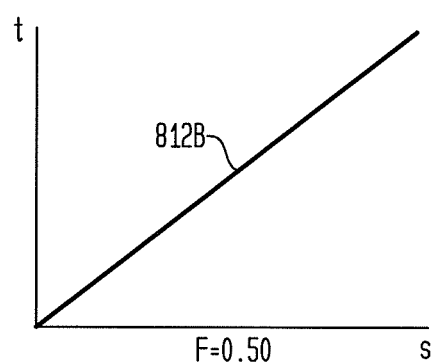
Figure 8C:
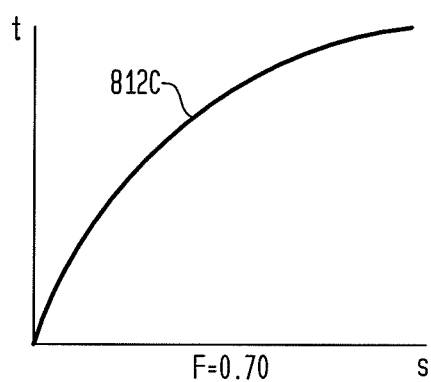

FIGS. 8A, 8B, and 8C illustrate examples of displacement functions with different fullness values according to this disclosure. The transition curves 812A, 812B, and 812C illustrated in FIGS. 8A, 8B, and 8C can be indicative of displacement function 750 illustrated in FIG. 7C with different fullness values 784 (or 794). For example, FIG. 8A illustrates a transition curve 812A with displacement function 750 having a fullness value 784 of 0.30. FIG. 8B illustrates a transition curve 812B with displacement function 750 having a fullness value 784 of 0.50. FIG. 8C illustrates a transition curve 812C with displacement function 750 having a fullness value 784 of 0.70.

Figure 9A:
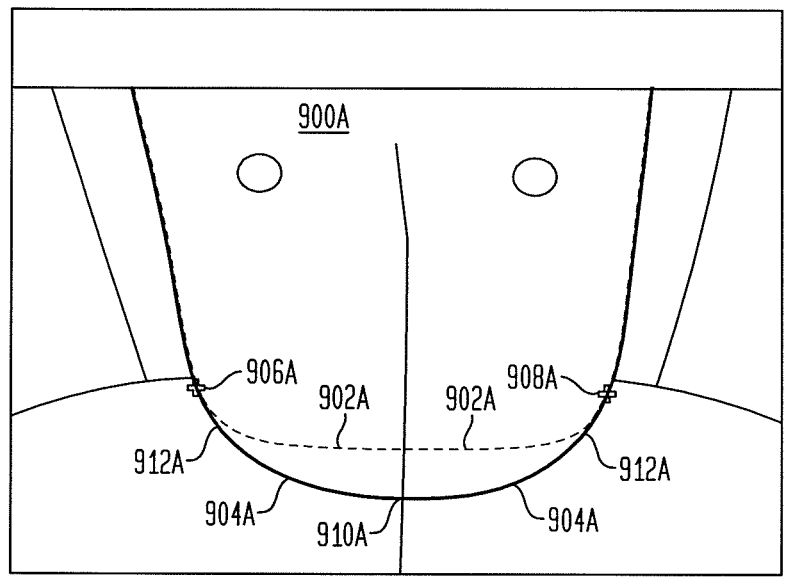
FIGS. 9A and 9B illustrate examples of CAD models with shape changes from original curves to transition curves overlaying the intended positions of new curves according to this disclosure.
Figure 9B:
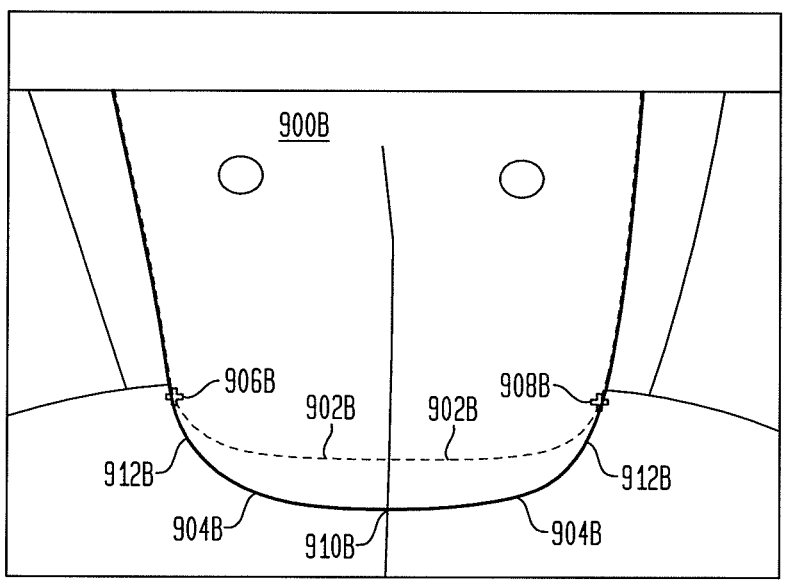

FIGS. 9A and 9B illustrate examples of CAD models 900A and 900B with shape changes from original curves 902A and 902B to transition curves 912A and 912B overlaying the intended positions of new curves 904A and 904B between limit points 906A and 908A as well as 906B and 908B, respectively, according to this disclosure. In an embodiment, the curves can represent seams in a CAD model of a fabric. The system 100 may have previously pulled the offset points 910A and 910B to intersect with at least one point of the new curves 904A and 904B, respectively. New curves 904A and 904B can be represented by the same displacement function but can require different fullness values based on the variations in shape. Accordingly, as shown in FIG. 9A, the system 100 can modify the fullness value of the displacement function of the transition curve 912A to 0.70 so that transition curve 912A can overlay the intended position of new curve 904A. Furthermore, as shown in FIG. 9B, the system 100 can modify the fullness value of the displacement function of the transition curve 912B to 0.90 so that transition curve 912B can overlay the intended position of new curve 904B. In an embodiment, once the transition curves 912A and 912B are overlaid the intended positions new curves 904A and 904B, respectively, the system 100 can delete the original curves 902A and 902B.

Figure 10A:
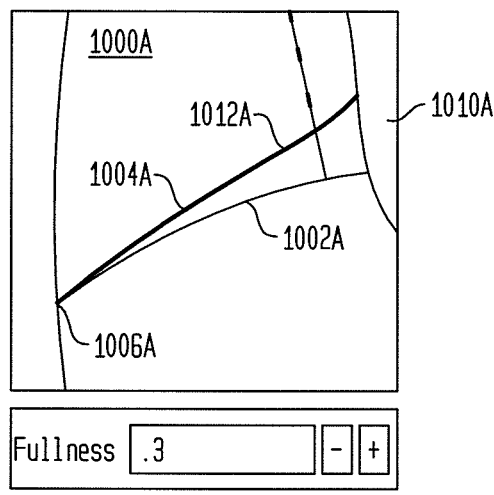
FIGS. 10A, 10B, and 10C illustrate examples of CAD models with shape changes from original curves to transition curves overlaying new curves according to this disclosure.
Figure 10B:
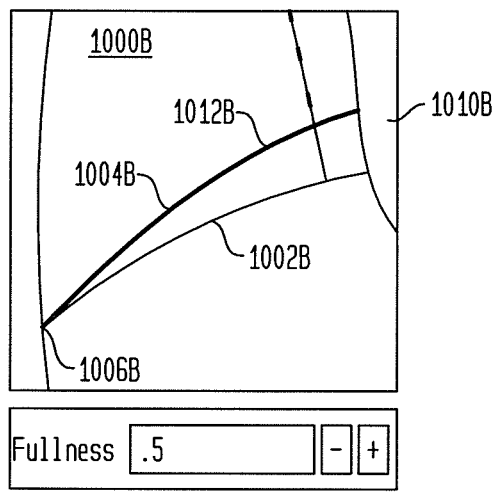
Figure 10C:
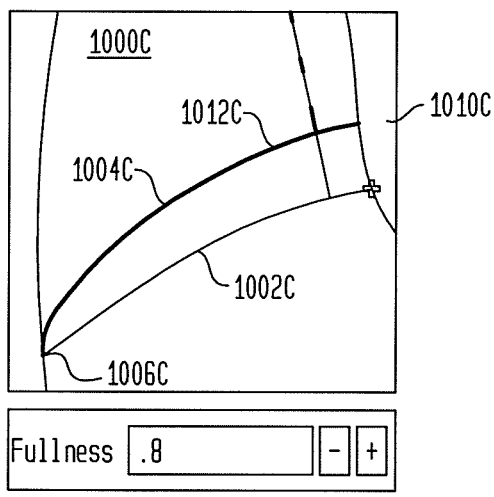

FIGS. 10A, 10B, and 10C illustrate examples of CAD models 1000A, 1000B, and 1000C with shape changes from original curves 1002A, 1002B, and 1002C to transition curves 1012A, 1012B, and 1012C overlaying new curves 1004A, 1004B, and 1004C between limit points 1006A and 1010A, 1006B and 1010B, as well as 1006C and 1010C, respectively, according to this disclosure. In an embodiment, the curves can represent seams in a CAD model of a fabric. Limit points 1010A, 1010B, and 1010C can also be offset points. The system 100 may have previously pulled the offset points 1010A, 1010B, and 1010C to intersect with at least one point of the new curves 1004A, 1004B, and 1004C, respectively. New curves 1004A, 1004B, and 1004C can be represented by the same displacement function but can require different fullness values based on the variations in shape. Accordingly, as shown in FIG. 10A, the system 100 can modify the fullness value of the displacement function of the transition curve 1012A to 0.30 so that transition curve 1012A can overlay the intended position of new curve 1004A. Furthermore, as shown in FIG. 10B, the system 100 can modify the fullness value of the displacement function of the transition curve 1012B to 0.50 so that transition curve 1012B can overlay the intended position of new curve 1004B. Additionally, as shown in FIG. 10C, the system 100 can modify the fullness value of the displacement function of the transition curve 1012C to 0.80 so that transition curve 1012C can overlay the intended position of new curve 1004C. In an embodiment, once the transition curves 1012A, 1012B, and 1012C are overlaid, they become the new curves 1004A, 1004B, and 1004C, respectively. Subsequently, the system 100 can delete the original curves 1002A, 1002B, and 1002C.

Figure 11A:
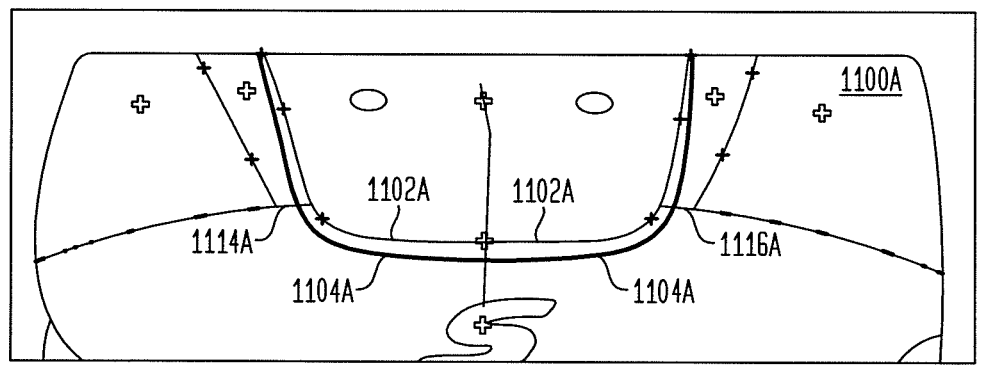
FIG. 11A illustrates an example of a CAD model with an original curve, a new curve, and one or more connecting curves according to this disclosure.

In an embodiment, after modifying a curve or seam of a fabric in a CAD model, the system 100 can modify one or more connecting curves or seams intersecting with the original curve or terminating at the original curve so that the one or more connecting curves or seams intersect with the new curve or terminate at the new curve. FIG. 11A illustrates an example of a CAD model system 1100A with an original curve 1102A, a new curve 1104A, and one or more connecting curves 1114A and 1116A according to this disclosure. As illustrated in FIG. 11A, the one or more connecting curves 1114A and 1116A can terminate at the original curve 1102A. The system 100 can recognize the one or more connecting curves 1114A and 1116A and that the one or more connecting curves 1114A and 1116A terminate at the original curve 1102A. The system 100 can also identify the new curve 1104A and modify the one or more connecting curves 1114A and 1116A so that they terminate at new curve 1104A instead of the original curve 1102A or the location of the original curve 1102A before the original curve 1102A was deleted. The system 100 can trim, extend, bend, or straighten one or more connecting curves so that the connecting curve aligns with new curve as they previously aligned with the original curve.

Figure 11B:
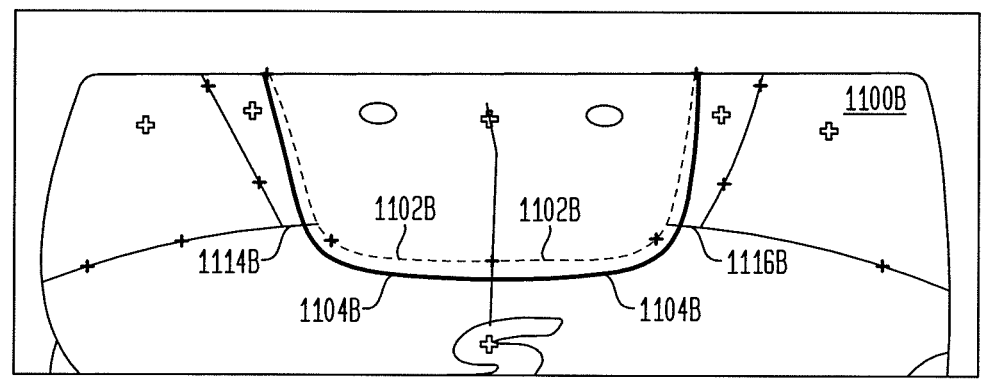
FIG. 11B illustrates an example of a CAD model with an indication of the location of the original curve, a new curve, and one or more connecting curves according to this disclosure.

FIG. 11B illustrates an example of a CAD model system 1100B with an indication of the location of the original curve 1102B, a new curve 1104B, and one or more connecting curves 1114B and 1116B according to this disclosure. As illustrated in FIG. 11B, the system 100 has modified the one or more connecting curves 1114B and 1116B so that they terminate at the new curve 1104B instead of the location of the original curve 1102B. In an embodiment, the system 100 can also modify one or more nearby curves that may not intersect with an original curve when an original curve is replaced with a new curve so that the distances or relative distances of the one or more nearby curves and new curve is the same as the distances or relative distances of the one or more nearby curves and the location of the original curve.

FIGS. 12A-12P illustrate example diagrams of curve or seam modification use cases according to this disclosure. FIGS. 12A-12P illustrate different curve or seam modifications with different displacement functions. As discussed herein, the system 100 can modified a curve or seam in a CAD file from an original curve to a new curve using a transition curve. The system 100 can modify a curve or seam in a CAD file many different ways including by moving an offset point and changing a fullness value. FIGS. 12A-12P illustrate sixteen use case examples of how curves can be modified by the system 100.

FIG. 13 illustrates an example diagram of a user interface associated with the system 100 according to this disclosure. The system 100, via the user interface 1318 can be configured to receive inputs to modify a curve or seam. For example, through the user interface 1318, the system 100 can receive one or more inputs in a curve type space 1320 indicating a type of curve to be implemented as the new curve. Through the user interface 1318, the system 100 can receive one or more inputs in an offset point space 1322 indicating the location of one or more offset points of a transition curve to be implemented when form the new curve. Through the user interface 1318, the system 100 can receive one or more inputs in a limit point space 1324 indicating the location of one or more limit points of a transition curve to be implemented when forming the new curve. Through the user interface 1318, the system 100 can receive one or more inputs in a maximum offset space 1326 indicating the maximum perpendicular distance from a tangent line of one or more offset points that a transition curve can moved when forming the new curve. Through the user interface 1318, the system 100 can receive one or more inputs in a fullness value space 1328 indicating the fullness value of a displacement function of a transition curve so that the transition curve can overlay the new curve. Through the user interface 1318, the system 100 can receive an input from the modify box 1330 to implement any one or more of the above parameters. For example, after the system 100 has positioned the transition curve in the intended location of the new curve, the curve can be further modified based on any of the above parameters or inputs. Reverse direction box 1332 can be used to change the direction of the maximum offset 1326. For example, if maximum offset is 20 mm and the reverse direction box 1332 is not selected, the maximum offset can be 20 mm in a first direction. Conversely, if the reverse direction box 1332 is selected, the maximum offset can be 20 mm in a second direction opposite the first direction.

FIG. 14 illustrates an example method 1400 to be performed by a data processing system 100 in a CAD system on a CAD model with one or more curves according to this disclosure. At step 1405, the data processing system 100 can identify an original curve and an intended location of a new curve in a CAD model. In an embodiment, the data processing system 100 can be configured to identify two or more limit points along the original curve when identifying the original curve.

At step 1410, the data processing system 100 can generate a transition curve from the original curve. In an embodiment, the data processing system 100 can generate a transition curve from a portion of the original curve between two limit points.

At step 1415, the data processing system 100 can determine a displacement function of the new curve and apply the displacement function to the transition curve. In an embodiment, the displacement function can include two or more control points.

At step 1420, the data processing system 100 can combine two or more control points of the displacement function into one transition curve control point. In an embodiment, the transition curve control point can be controlled based on a fullness value.

At step 1425, the data processing system 100 can adjust the transition curve control point based on the fullness value so that transition curve overlays the intended location of the new curve. In an embodiment, the fullness value can be a relative distance in a Cartesian coordinate graph between a point along the displacement function and another point in the Cartesian coordinate graph. In an embodiment, the data processing system 100 can identify a midpoint of a line of the displacement function in a Cartesian coordinate graph and can adjust a distance from the midpoint of the line of the displacement function to point in the Cartesian coordinate graph in order to adjust the transition curve control point based on the fullness value.

At step 1430, after modifying a curve or seam of a fabric in a CAD model, the system 100 can modify one or more connecting curves or seams intersecting with the original curve or terminating at the original curve so that the one or more connecting curves or seams intersect with the new curve or terminate at the new curve.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle.

What is claimed is:

1. A method for modifying a curve in a computer-aided design (CAD) model, the method performed by a data processing system and comprising:
    identifying an original curve and a location of a new curve in a CAD model, including identifying at least two limit points and an offset point along the original curve;
    generating a transition curve from the original curve by the offset point moving the original curve to a position of the new curve such that at least one point of the transition curve intersects along the location of the new curve;
    determining a displacement function of the new curve and applying the displacement function to the transition curve, such that the transition curve overlays the new curve in a same position and with a same shape, wherein the displacement function includes two or more controls that control a plurality of associated control points, which each control controls a movement of an associated control point so as to shape the transition curve into the shape of the new curve;
    combining the two or more controls into one transition curve control such that movement of associated control points is locked in unison;
    adjusting the transition curve control based on a fullness value so that the transition curve overlays the location of the new curve, the fullness value indicating a movement distance of the associated control points controlled in unison by the transition curve control; and
    generating the CAD model with the transition curve based on the determined displacement function and the adjusted transition curve control.

2. The method of claim 1, further comprising deleting the original curve after the transition curve overlays the location of the new curve.

3. The method of claim 1, wherein identifying the original curve comprises identifying two or more limit points along the original curve.

4. The method of claim 1, further comprising after adjusting the transition curve control based on the fullness value so that the transition curve overlays the location of the new curve, modifying one or more connecting curves which terminate at one or more points along the original curve so that the one or more connecting curves terminate at one or more points along transition curve.

5. The method of claim 1, further comprising offsetting at least one offset point along the transition curve a distance so that transition curve intersects at least at a point along the location of the new curve before adjusting the transition curve control.

6. The method of claim 1, wherein the fullness value is a distance in a Cartesian coordinate graph between a point along the displacement function and another point in the Cartesian coordinate graph.

7. The method of claim 6, further comprising the transition curve control adjusting the movement of the locked associated control points based on the fullness value comprises identifying a midpoint of a line of the displacement function in the Cartesian coordinate graph and adjusting a distance from the midpoint of the line of the displacement function to another point in the Cartesian coordinate graph.

8. A data processing system for a computer-aided design (CAD) system, the data processing system comprising:
    a processor; and
    an accessible memory, the data processing system particularly configured to:
    identify an original curve and a location of a new curve in a CAD model, including identifying at least two limit points and an offset point along the original curve;
    generate a transition curve from the original curve by the offset point moving the original curve to a position of the new curve such that at least one point of the transition curve intersects along the location of the new curve;
    determine a displacement function of the new curve and apply the displacement function to the transition curve, such that the transition curve overlays the new curve in a same position ad with a same shape, wherein the displacement function includes two or more controls that control a plurality of associated control points, which each control controls a movement of an associated control point so as to shape the transition curve into the shape of the new curve;
    combine the two or more controls into one transition curve control such that movement of associated points is locked;
    adjust the transition curve control based on a fullness value so that transition curve overlays the location of the new curve, the fullness value indicating a movement distance of the associated control points controlled in unison by the transition curve control; and
    generate the CAD model with the transition curve based on the determined displacement function and the adjusted transition curve control.

9. The data processing system of claim 8, wherein the data processing system is further particularly configured to delete the original curve after the transition curve overlays the location of the new curve.

10. The data processing system of claim 8, wherein the data processing system is further particularly configured to identify two or more limit points along the original curve when identifying the original curve.

11. The data processing system of claim 8, wherein the data processing system is further particularly configured to modify one or more connecting curves which terminate at one or more points along the original curve so that the one or more connecting curves terminate at one or more points along transition curve after the data processing system adjusts the transition curve control based on the fullness value so that the transition curve overlays the location of the new curve.

12. The data processing system of claim 8, wherein the data processing system is further particularly configured to offset at least one offset point along the transition curve a distance so that transition curve intersects at least at a point along the location of the new curve before adjusting the transition curve control.

13. The data processing system of claim 8, wherein the fullness value is a distance in a Cartesian coordinate graph between a point along the displacement function and another point in the Cartesian coordinate graph.

14. The data processing system of claim 13, wherein the data processing system is further particularly configured to identify a midpoint of a line of the displacement function in the Cartesian coordinate graph and adjust a distance from the midpoint of the line of the displacement function to another point in the Cartesian coordinate graph in order to adjust the movement of the locked associated control points based on the fullness value.

15. A non-transitory computer-readable medium encoded with executable instructions that, when executed, cause one or more data processing systems to:

identify an original curve and a location of a new curve in a CAD model, including identifying at least two limit points and an offset point along the original curve;

generate a transition curve from the original curve by the offset point moving the original curve to a position of the new curve such that at least one point of the transition curve intersects along the location of the new curve;

determine a displacement function of the new curve and apply the displacement function to the transition curve, such that the transition curve overlays the new curve in a same position and with a same shape, wherein the displacement function includes two or more control points that control a plurality of associated control points, which each control controls a movement of an associated control point so as to shape the transition curve into the shape of the new curve;

combine the two or more control points into one transition curve control such that movement of associated control points is locked in unison;

adjust the transition curve control based on a fullness value so that transition curve overlays the location of the new curve, the fullness value indicating a movement distance of the associated control points controlled in unison by the transition curve control; and generate the CAD model with the transition curve based on the determined displacement function and the adjusted transition curve control.

16. The computer-readable medium of claim 15, wherein the instructions further cause the one or more data processing systems to delete the original curve after the transition curve overlays the location of the new curve.

17. The computer-readable medium of claim 15, wherein the instructions further cause the one or more data processing systems to identify two or more limit points along the original curve when identifying the original curve.

18. The computer-readable medium of claim 15, wherein the instructions further cause the one or more data processing systems to modify one or more connecting curves which terminate at one or more points along the original curve so that the one or more connecting curves terminate at one or more points along transition curve after the transition curve control is adjusted based on the fullness value so that the transition curve overlays the location of the new curve.

19. The computer-readable medium of claim 15, wherein the instructions further cause the one or more data processing systems to offset at least one offset point along the transition curve a distance so that transition curve intersects at least at a point along the location of the new curve before adjusting the transition curve control.

20. The computer-readable medium of claim 15, wherein the instructions further cause the one or more data processing systems to identify a midpoint of a line of the displacement function in a Cartesian coordinate graph and adjust a distance from the midpoint of the line of the displacement function to another point in the Cartesian coordinate graph in order to adjust the movement of the locked associated control points based on the fullness value.

* * * * *